United States Patent [19]

Doty et al.

[11] Patent Number: 4,689,247
[45] Date of Patent: Aug. 25, 1987

[54] PROCESS AND APPARATUS FOR FORMING THIN FILMS

[75] Inventors: Mitchell E. Doty, Chalfont; Thom V. Bernitsky, North Wales, both of Pa.

[73] Assignee: Ametek, Inc., New York, N.Y.

[21] Appl. No.: 863,929

[22] Filed: May 15, 1986

[51] Int. Cl.$^4$ .............................................. B05D 5/12
[52] U.S. Cl. ............................ 427/126.1; 427/248.1; 427/255.2; 118/300; 136/260; 136/264
[58] Field of Search ..................... 427/421, 87, 248.1, 427/255.2, 76, 126.1, 126.2; 118/300, 326; 136/260, 264

[56] References Cited

U.S. PATENT DOCUMENTS

| Re. 29,812 | 10/1978 | Jordan et al. |
|---|---|---|
| 2,486,955 | 11/1949 | Langwill . |
| 2,576,289 | 11/1951 | Fink . |
| 2,943,957 | 7/1960 | Grattidge et al. . |
| 2,959,499 | 11/1960 | Herczog et al. . |
| 3,048,146 | 8/1962 | Coppola .......................... 118/301 |
| 3,387,607 | 6/1968 | Gauthier et al. . |
| 3,407,085 | 11/1968 | Kitaj et al. . |
| 3,432,330 | 3/1969 | Diefendorf . |
| 3,432,331 | 3/1969 | Braddy et al. . |
| 3,436,257 | 4/1969 | Myers . |
| 3,486,931 | 12/1969 | Dreyfus . |
| 3,522,075 | 7/1970 | Kiel . |
| 3,702,780 | 11/1972 | Withers .......................... 427/314 |
| 3,840,391 | 10/1974 | Spitz et al. .......................... 427/57 |
| 3,852,098 | 12/1974 | Bloss .......................... 427/226 |
| 3,880,633 | 4/1975 | Jordan et al. . |
| 4,123,244 | 10/1978 | Leclercq et al. . |
| 4,125,391 | 11/1978 | Van Laethem . |
| 4,132,357 | 1/1979 | Blackinton . |
| 4,224,355 | 9/1979 | Lampkin et al. . |
| 4,240,816 | 12/1980 | McMaster et al. . |
| 4,260,427 | 4/1981 | Fulop et al. . |
| 4,327,119 | 4/1982 | Lis et al. . |
| 4,336,285 | 1/1982 | Squillante . |
| 4,397,671 | 8/1983 | Vong .......................... 427/421 |

Primary Examiner—Sam Silverberg
Assistant Examiner—Terry J. Owens
Attorney, Agent, or Firm—Amster, Rothstein & Ebenstein

[57] ABSTRACT

Process and apparatus are disclosed for forming excellent quality, large area thin films essentially without discontinuities and inhomogenuities, particularly for photovoltaic solar cells. The reactants are conducted past a heated substrate in a relatively thin gap, e.g., 0.030 inch, in a turbulent flow. In a specific embodiment, the reactants are contained in nebuli of an atomized solution, and the nebuli are sorted, preferably by gravity, prior to introduction thereof into the gap to prevent introduction of larger size nebuli into the reaction gap.

11 Claims, 12 Drawing Figures

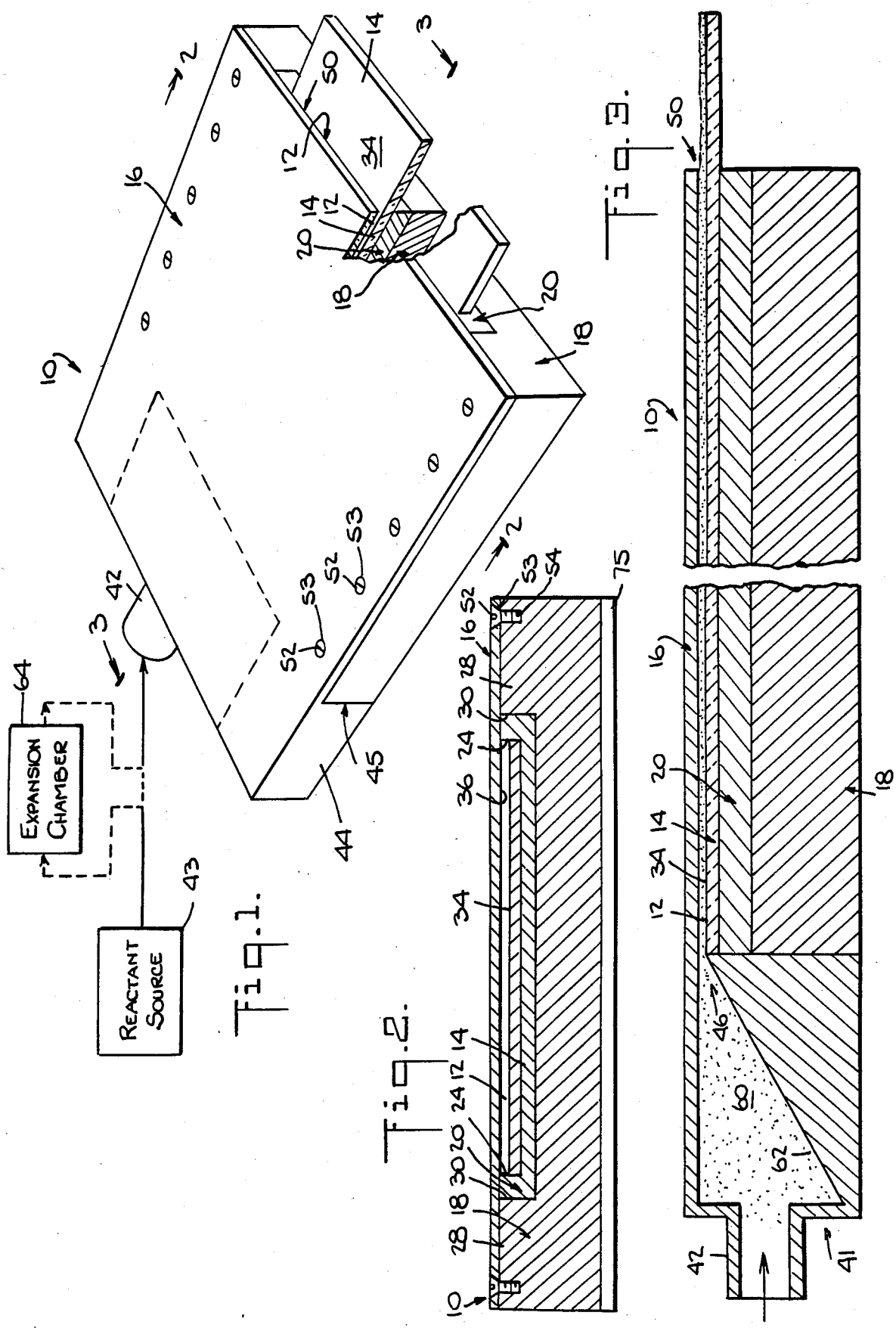

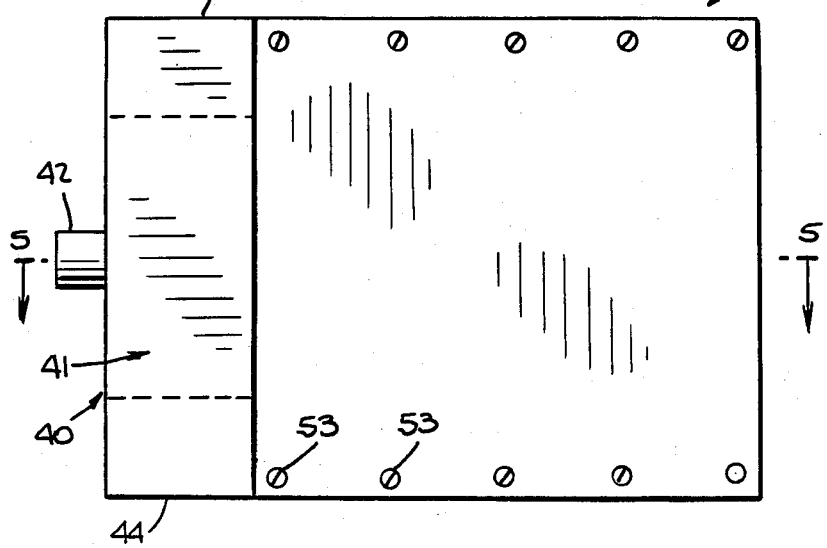
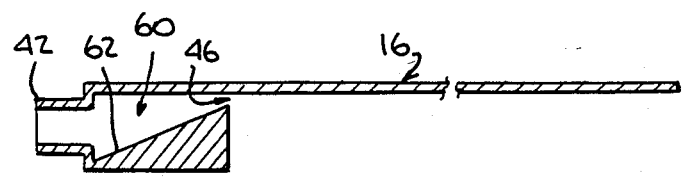
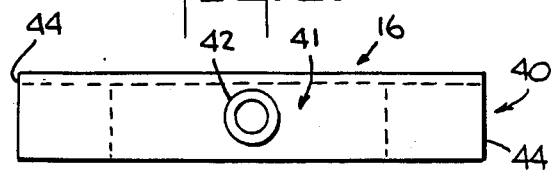
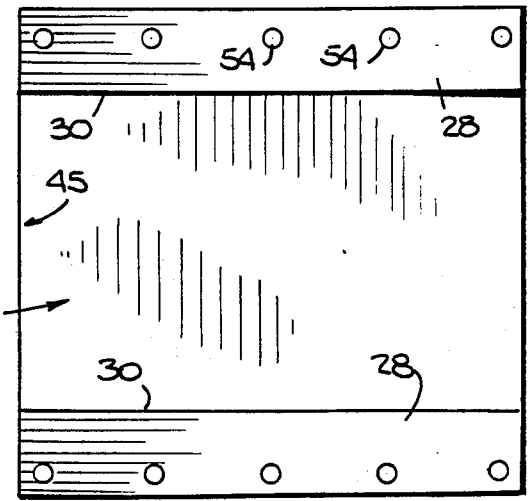
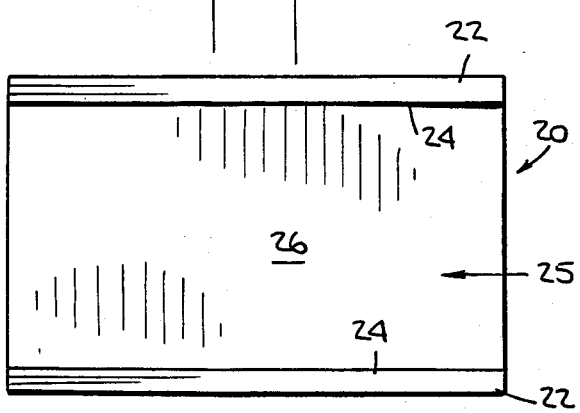

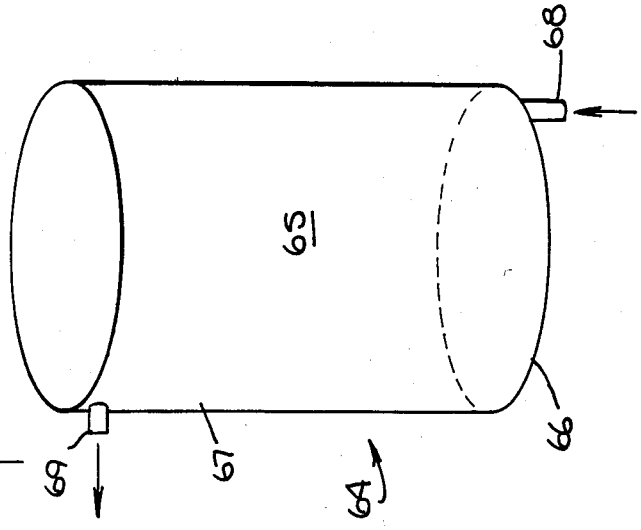
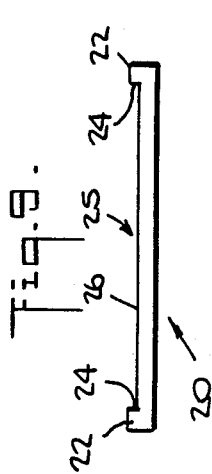
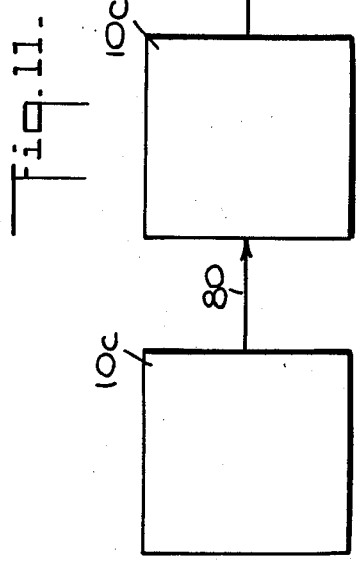
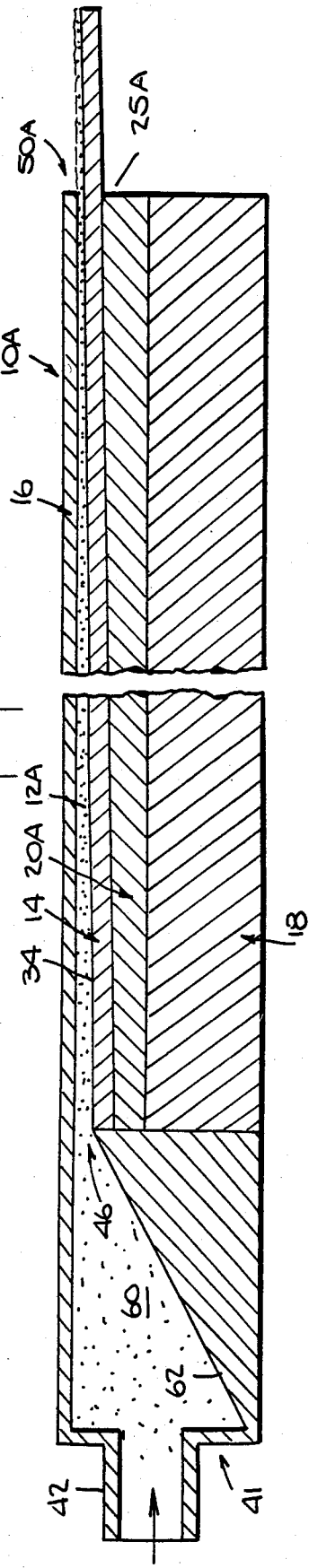

PROCESS AND APPARATUS FOR FORMING THIN FILMS

BACKGROUND OF THE INVENTION

The present invention relates to a process and apparatus for forming thin films on a substrate, for example, thin films of electrical conductors, semiconductors and/or insulating material, and particularly to forming large area thin films for photovoltaic solar cells.

Thin films constituting parts of solar cells may be deposited on a substrate (or on one or more layers overlying the substrate) using a number of processes including vapor deposition, electrodeposition, sputtering and various spray coating processes. The quality and characteristics of such films vary with the size of the thin film, the particular process used and with specific techniques utilized in carrying out a specific process. In a spray pyrolysis process, for example, the substrate is heated and a spray or atomized mist which includes one or more reactants is conducted by a gaseous carrier medium into contact with the heated substrate. The film may be formed from a single reactant which either releases or is the film substance or from two or more reactants which chemically react to release or form the film substrate. In either case, a chemical reaction takes place at the surface of the substrate causing the substance to be formed or deposited on the substrate surface as a thin film, while spent and unreacted reactants are volatized, evaporated or otherwise conducted away from the substrate with the gaseous carrier medium.

One goal in the production of thin film solar cells has been to economically produce large area (e.g., approximately 6 in. by 6 in. and larger) solar cells of high efficiency. Such large area solar cells may be used as large area solar cell panels in large solar energy conversion arrays or, when subdivided into smaller isolated cells, as solar batteries for devices such as watches and calculators. Heretofore, typical efficiencies obtained for large area solar cells were in the range of about 4% to about 6%. For example, U.S. Pat. No. 3,880,633 (Jordan et al.) discloses a spray coating process for making solar cells including an $SnO_x$ layer, a CdS layer and a $Cu_2S$ layer on a large scale basis, i.e., as a continuous strip 10 feet wide, from which 4 ft. by 8 ft. panels are cut. The Jordan et al. Patent contemplates solar cell efficiencies of only about 5% with efficiencies of up to 8% thought to be feasible. U.S. Pat. No. 4,224,355 (Lampkin et al.) discloses the formation of large area photovoltaic cells (e.g., four square feet) having $SnO_x$, CdS (or ZnS or ZnCdS) and $Cu_2S$ layers using a spray coating process. The Lampkin et al. Patent appears also to contemplate efficiencies of only about 5%. U.S. Pat. Nos. 4,125,391 (Van Laethem) and 4,123,244 (Leclercq et al.) disclose spray processes for forming a coating on a glass substrate. The Van Laethem and Leclercq et al. Patents disclose that the substrate may be in excess of one meter wide. U.S. Pat. Nos. 4,327,119 (Lis et al) and 4,336,285 (Squillante) disclose spray processes for making photovoltaic cells having ZnCdS, CdTe and Aquadag layers on an indium tin oxide coated glass substrate.

It has been difficult, however, to economically provide large area thin films of uniform good quality which are devoid of inhomogenuities and discontinuities by such processes, particularly for large area solar cells. It has also been difficult to increase the efficiency of solar cells made by such processes.

OBJECTS AND SUMMARY OF THE INVENTION

It is accordingly an object of the present invention to form relatively large area thin films of uniform quality.

It is another object of the present invention to from relatively large area thin films of uniform quality essentially without inhomogenuities and discontinuities.

It is another object of the present invention to provide good quality thin films for photovoltaic devices.

It is another object of the present invention to provide such films for use in higher efficiency solar cells, particularly large area photovoltaic cells.

It is another object of the present invention to provide a process for forming such films.

It is another object of the present invention to provide apparatus for carrying out such a process.

The present invention achieves the above and other objects in providing a process for forming a thin film on a substrate (which may include one or more thin film layers thereon) and an apparatus for carrying out the process in which one or more reactants (e.g., nebuli of an atomized mist which contains the one or more reactants in liquid solution, or one or more gaseous reactants) are conducted along a heated substrate in a contacting relationship therewith in a turbulent, narrow flow, at a rapid rate. Preferably, the thickness of the flow is less than about 0.10 in. (2.54 mm), and preferably in the approximate range of about 0.020 in. (0.508 mm) to about 0.10 in. (2.54 mm). Preferably, the flow has a linear velocity of between 100 and several hundred cm per second. In specific embodiments of the process, the one or more reactant(s) are conducted past the substrate at ambient pressure by a gaseous carrier medium.

The flow rate and the concentration of the reactant(s), and the substrate temperature are controlled to control the reaction rate at the substrate surface, i.e., the rate at which the film is formed on the substrate. A turbulent flow and a rapid flow rate of the reactant(s) in a narrow reaction gap adjacent the surface of the substrate on which the film is to be formed and such control of the reaction rate have been found, unexpectedly, to provide good quality thin films.

In a spray pyrolysis process according to the invention, an atomized mist of the reactant(s) is formed and the mist nebuli containing the reactant(s) are conducted by a gaseous carrier medium over the substrate. Although the precise mechanism by which the film is formed from mist nebuli is not completely understood, it is believed that individual mist nebuli in the carrier medium are prevented from dwelling in a contacting relationship with any area of the substrate for a time long enough for all of the reactant(s) contained in the nebuli to be formed into the film. Rather, it is believed that only partial deposition of the reactant(s) from respective nebuli takes place from contact thereof with the substrate in any specific contact area before the respective nebuli are conducted away from the substrate or into contact with another area of the substrate. It is believed that because the reactant(s) move rapidly past the substrate and are substantially always in motion with suspended solids, liquid nebuli and carrier gas phases in motion relative to each other as they move in contact with the substrate, that the mechanism of the reaction which deposits the film proceeds to provide, unexpectedly, even product distribution. It is further believed that the process of the invention, in which these effects are combined, provides a film which is different from prior art films.

The process according to the invention, in which a narrow reaction gap is provided, apparently utilizes turbulence promoting mechanisms to a surprisingly effective degree. Even at relatively low linear flow rates of the order of 100 cm per second, film thickness distribution from side to side and from front to back on a six inch square glass substrate is surprisingly consistent, varying not more than 10%, whereas if the transport were of a laminar flow nature, localized boundary layer reactant depletion would tend to give much more unevenness of product distribution. If the mode were laminar flow, a decreasing film thickness from entrance to exit ends (in a constant thickness reaction gap) would be expected to result from thickening of the diffusion boundary layer as reactants were consumed (which does not occur in films produced in accordance with the invention). Also, substrate imperfections would be expected to cause trails or rivulets of product thickness profiles extending far from the imperfection site, (protuberances or pits in the substrate due to surface roughness) in laminar flow transport mechanisms. These trails or rivulets extending downstream from surface roughness sites are not found in films made in accordance with the process of the invention.

In the process according to the invention, at least two turbulence promotion mechanisms act in an additive way to provide surprisingly good film thickness distribution. These mechanisms are described below using cadmium sulfide as an example. Cadmium sulfide is known to form from water solutions of cadmium ions ($Cd^{+2}$) and sulfide ions ($S^{-2}$), at low temperatures, using known sulfide ion precurser, thiourea, which hydrolyzes to $S^{--}$. Hence, CdS is formed in the evaporating liquid reactant feed droplets (nebuli). This CdS, formed within the evaporating droplet as well as any nebuli themselves, are exited out of the reaction gap. It is believed that this extremely small solid and liquid phase material suspended within the carrier gas results in churning and turbulence, which aid in bringing fresh reactant to the heated substrate.

A second or third effect promoted in the process according to the invention by the superimposed transverse directed motion of material over the substrate is the utilization in a unique manner of the rapid increase in gas volume as liquid nebuli are converted to steam on the heated substrate. This transfer of steam generated at the hot substrate and directed from front to back by the carrier gas velocity tends to prevent a static reactant depleted boundary layer, further aiding in prevention of undesirable unevenness of product.

It is believed that the narrow reaction gap is an important factor in the creation of the flow characteristics described above which provide excellent quality thin films.

In chemical vapor deposition, where gas (pressure times volume) product increases due to thermal decomposition via a reaction e.g., silane or chlorosilane→Si solid +$2H_2$ and/or 2 HCl, it is believed that improved film uniformity over films made according to current reactor processes can be obtained utilizing a narrow reaction gap as described above, particularly because of the effects described above.

Even further improvement in the quality of a thin film formed from mist nebuli by pyrolysis may be obtained in accordance with the invention by sorting, preferably by gravity, the nebuli of the atomized mist before they are brought into contact with the substrate to prevent larger (e.g., heavier or more dense) nebuli from reaching the substrate. It has been unexpectedly found that such sorting combined with turbulent and rapid flow of gaseous carrier medium conducted reactant(s) in the narrow reaction gap provides excellent quality, large area thin film substantially without inhomogenuities and discontinuities.

For example, in depositing thin films of CdS at a substrate temperature of 450° C., from $Cd^{+2}$ and $S^{-2}$, by bringing a nitrogen (carrier medium) conducted atomized mist of the reactants into contact with the substrate in a gap 7 in. wide having a thickness of about 0.030 in. (7.62 mm), at a carrier flow rate of 15 SCFH and a mist solution delivery rate of 2.1 ml/min., assuming gas equilibrates at 400° C., the mist nebuli travel at about 110 in/sec (273 cm/sec) and require only about 0.055 sec. to traverse the substrate. Accordingly, mist nebuli do not dwell on the surface substrate, and the reaction time is relatively fast.

Use of the process according to the invention has unexpectedly been found to effectively form large area (e.g., 7 in. by 13 in. (17.78 cm by 33.02 cm) thin films of improved film quality. The process and apparatus were scaled from a 3 inch width up to a 7 inch width without difficulty and it is believed that the process and apparatus can be further scaled without difficulty to produce even larger area thin films. Using the process and apparatus of the invention, heterojunction photovoltaic cells having combinations of CdTe and CdS layers on a $SnO_2$ coated glass substrate have been fabricated. Such cells were found to have efficiencies of greater than 10%, for 4.0 $cm^2$ cells.

The invention also includes apparatus for carrying out the process of forming such films. The apparatus provides a narrow reaction gap adjacent the substrate and includes structure which causes, in combination with the flow rate of the reactants and gap thickness, a turbulent flow of the reactant(s) in the reaction gap. The specific configuration of the reaction gap corresponds to the configuration of the surface of the substrate to be coated, and the reaction gap may be of uniform or non-uniform thickness. For example, for a substrate having a planar surface to be coated, the reaction gap may be formed by the substrate surface and a planar surface disposed opposite the substrate surface spaced thereform by the thickness of the reaction gap. The planar surface may be arranged parallel to the substrate surface to form a reaction gap of uniform thickness or at an angle thereto to form a reaction gap of varying thickness. In a specific embodiment of the apparatus, it operates at ambient pressure and a gaseous carrier medium is used to conduct the reactant(s) past the substrate. In order to permit the reactant(s) to be conducted past the substrate surface, means are provided for introducing the reactant(s) into the reaction gap and for removing unreacted and/or spent reactant and the carrier medium from the reaction gap.

Although the invention contemplates that turbulence can be generated in gaseous carrier medium conducted reactant(s) in different ways, in a specific embodiment, creation of a turbulence flow is assisted by forcing the reactant(s) to pass through a constriction located adjacent and upstream of the reaction gap. According to a presently preferred embodiment, the means for introducing the reactant(s) into the reaction gap includes an entrance section disposed adjacent and immediately upstream of the reaction gap, the entrance section having a cross-sectional area which is larger than that of the reaction gap. The entrance section may include a transistion portion which changes in cross-sectional area from a larger cross-sectional area nearer an inlet thereof to a smaller cross-sectional area equal to that of the reaction gap nearer an outlet of the entrance section which outlet is in communication with or may form an inlet or entrance of the gap.

Different structures may be utilized for sorting reactant nebuli in the carrier medium in accordance with the invention. According to a specific embodiment, the reactant(s) are forced to flow upwardly prior to introduction into the gap so that larger nebuli (e.g., heavier or more dense nebuli) are sorted by gravity, i.e., are separated from the carrier medium as it moves upwardly and fall by gravity, rather than being introduced with the carrier medium into the reaction gap. According to a preferred embodiment, the reactant(s) are caused to traverse a primary gravity sorter and a secondary or final gravity sorter. The primary gravity sorter may be an upwardly slanted gravity tube, e.g., one foot in length, through which the mist nebuli flow upwardly before being introduced into the narrow reaction gap apparatus and in which the larger nebuli fall by gravity and are not introduced into the narrow reaction gap apparatus. The final gravity sorter may be an upwardly inclined surface, which may be the transition portion in the entrance section described above, the upper end of which is disposed adjacent the inlet or entrance of the reaction gap. Alternatively, a gravity nebuli sorter expansion chamber may be utilized. The expansion chamber, which may include baffling, screens, trapping devices, etc., to assist in nebuli sorting, may be utilized with conventional, wide nebuli size distribution spray nozzles, and in some applications may be preferred.

The above and other objects, aspects, advantages and features of the invention will be more readily perceived from the description of the preferred embodiments taken in conjunction with the accompanying drawings and appended claims.

BRIEF DESCRIPTION OF THE DRAWINGS

The present invention is illustrated by way of example and not limitation in the figures of the accompanying drawings, in which like references indicate like parts, and in which:

FIG. 1 is a perspective view, partially broken away and partially in section, of apparatus which carries out the process of the invention and which forms a large area thin film according to the invention, the apparatus including a narrow reaction gap of uniform thickness;

FIG. 2 is a sectional view of the apparatus of FIG. 1 taken along line 2—2 of FIG. 1, also showing diagramatically a heater disposed below the apparatus;

FIG. 3 is a sectional view of the apparatus of FIG. 1 taken along line 3—3 of FIG. 1;

FIG. 4 is a bottom plan view of the cover of the apparatus depicted in FIG. 1;

FIG. 5 is a sectional view of the cover of the apparatus depicted in FIG. 4 taken along line 5—5 of FIG. 4;

FIG. 6 is a front elevational view of the cover of the apparatus depicted in FIG. 4;

FIG. 7 is a top plan view of the base of the apparatus depicted in FIG. 1;

FIG. 8 is a top plan view of a carrier tray of the apparatus depicted in FIG. 1 which is received in the base of the apparatus;

FIG. 9 is an end elevational view of the carrier tray depicted in FIG. 8;

FIG. 10 is a sectional view, similar to that of FIG. 3, depicting an alternate embodiment of the apparatus of FIG. 1 in which a reaction gap of non-uniform thickness is provided above the substrate to be coated;

FIG. 11 is a diagram illustrating a process for depositing a number of thin films on the same substrate; and FIG. 12 is a perspective diagram of an expansion chamber gravity sorter through which a spray of reactants may be passed prior to introduction into the apparatus of FIG. 1.

DESCRIPTION OF THE PREFERRED EMBODIMENTS

Referring now to the drawings, embodiments of an apparatus, which can be referred to as a narrow reaction gap, channel flow reactor, according to the invention for carrying out a spray pyrolysis process and a chemical vapor deposition process according to the invention are illustrated. The narrow reaction gap, channel flow reactor 10 depicted in FIGS. 1-3 provides a reaction gap 12 of uniform thickness above a substrate 14. Reactor 10 includes a cover 16, a base 18 and a carrier tray 20. Carrier tray 20 (FIGS. 8-9) includes shoulders 22 having sidewalls 24 defining a channel 25 having a central planar portion 26 in which substrate 14 is received. Channel 25 and cover 16 together define a reaction chamber for substrate 14. Base 18 (FIGS. 2 and 7) includes shoulders 28 having sidewalls 30 defining a channel 32 in which carrier tray 20 is received. With substrate 14 in carrier tray 20, and carrier tray 20 in base 18 (FIG. 2), reaction gap 12 is formed by upper surface 34 of substrate 14, lower surface 36 of cover 16 and the portions of carrier tray sidewalls 24 extending above substrate 14. The height of sidewalls 24 of carrier tray 20 corresponds to the thickness of the substrate 14 to be coated plus the thickness of the reaction gap 12, and the width of carrier tray channel 25 corresponds to the width of the substrate 14. By providing carrier trays 20 having appropriately dimensioned channels 25, reactor 10 may be provided with different size reaction chambers to accommodate different thickness and width substrates and/or provide different thickness reaction gaps.

Cover 16 includes a front portion 40 in which an entrance section 41 (FIGS. 4-6) is formed adjacent one end of reaction gap 12 for introducing carrier medium conducted reactant(s into reaction gap 12. Entrance section 41 includes an inlet 42 through which carrier medium conducted reactant(s) (e.g., in nebuli of an atomized must or as gaseous reactant(s) from a source 43 (FIG. 1) are introduced into reactor 10. Cover 16 extends over entrance section 41 (FIG. 4) forming the top thereof and includes downwardly-extending side portions 44 which form the sides of entrance section 41. Front portion 40 including side portins 44 extends the full width of base 18 and is disposed adjacent the front 45 of base 18 (FIGS. 1 and 7) in an abutting relationship therewith in which entrance section 41 closes off channel 32 of base 18 except for narrow reaction gap 12. Entrance section 41 includes an outlet 46 (FIG. 5) which is coextensive in cross-section with and also forms the entrance of reaction gap 12. Outlet 46 of entrance section 41 corresponds in cross-sectional configuration and area to the cross-sectional configuration and area of reaction gap 12. One side 50 (FIG. 1) of reaction gap 12 which is opposite inlet 42 is open so that the carrier medium conducted reactant(s) can be conducted in reaction gap 12 over surface 34 of substrate 14 and exited through side 50. Cover 16 including front portion 40, and entrance section 41 may be made of stainless steel. Shoulders 28 of base 18 receive opposed longitudinal edges of cover 16 and thereby support cover 16. Cover 16 may be fastened to base 18 by means of screws 52 passing through holes 53 in the edges of cover 16 which are received in threaded holes 54 in base shoulders 28. Sealants, seals, gaskets, etc., are used as necessary to join cover 16 and base 18.

Entrance section 41 includes a hollow interior 60 (FIG. 5) which communicates inlet 42 with outlet 46. Interior 60 of entrance section 24 is configured so that the carrier medium conducted reactant(s) introduced into inlet 42 must rise vertically in order to pass through outlet 46 into reaction gap 12. In the embodiment depicted in the drawings, interior 60 has a greater volume adjacent inlet 42 than adjacent outlet 46, and inlet 42 is disposed vertically lower than outlet 46. The bottom of interior 60 includes a transition portion defined by an upwardly sloping surface 62 which extends from adjacent inlet 42 to adjacent outlet 46 and reduces the volume of the interior linearly with the distance from the inlet 42. Entrance section 41 functions as, among other things, a final gravity sorter, as described below.

A primary gravity tube sorter (not shown) is used in conjunction with a fine nebuli generator. The gravity tube sorter may be a delivery tube slanted upward, at least several inches and preferably about 1 foot, so as to gravity sort nebuli as it transports mist to the entrance section 41, passing only the smaller nebuli into the upper reaches of the delivery tube. Entrance section 41 (FIG. 3), functioning as a secondary or final nebuli sorter, allows any large nebuli and droplets to fall via gravity along the inclined surface 62 to the bottom of the entrance section. It is important that large nebuli and droplets not be allowed to pass into the reaction zone since it has been found that a wide distribution of nebuli size and particularly large nebuli and droplets lead to rough deposits.

Alternatively, expansion chamber 64 (FIG. 12) may be used as a gravity nebuli sorter in conjunction with more conventional spray nozzles which tend to give a wide nebuli size distribution. Chamber 64 comprises a cylindrical cavity 65 having an entrance section 66 adjacent the bottom of the cavity and an exit section 67 adjacent the top of the cavity. An inlet 68 is provided in the entrance section 66 and an outlet 69 is provided to the exit section 67. The exact dimensions of cavity 66 and/or the exact geometry (cylindrical vs. rectangular, etc., cross section) are not critical. For example, cavity 65 may be cylindrical having a diameter of about 30 cm and a height of about 30 to 60 cm. Chamber 64 provides both distance and time in the traversal of mist nebuli from inlet 68 to outlet 69 to allow efficient gravity sorting of nebuli, allowing only small nebuli to exit outlet 69 and pass into the reaction gap. Conventional, course mist eliminators, e.g., baffles, screens, electrostatic trapping devices, etc., could be incorporated into cavity 65 to aid in separating out large nebuli.

In order for the chemical reaction resulting in deposition of the film on substrate 14 to be carried out, it is necessary to heat the substrate. This may be accomplished conventionally by incorporating heating means (not shown) into base 18 or by placing reactor 10 on a heater 75 (FIG. 2). In the latter case, base 18 may be made of graphite. Cover 16 may be made of an insulating material or may function as a heat exchanger providing a temperature gradient over reaction gap 12.

In the embodiment of reactor 10 depicted in FIGS. 1–9, reaction gap 12 has a uniform thickness. In an alternate embodiment depicted in FIG. 10, reactor 10A has a reaction gap 12A of non-uniform thickness shown to linearly decrease with flow. To provide non-uniform reaction gap 12A, carrier tray 20A is provided having a channel 25A which slopes with flow.

Several thin films may be deposited on the same substrate in a single apparatus 10 by serially introducing appropriate reactants at appropriate times. This may be done manufacturally or apparatus may be provided in which introduction of a substrate into one reactor 10 and removal of the substrate from reactor 10 is automated. Alternatively, several apparatuses 10 may be utilized and a substrate moved from one apparatus to another either manually or automatically. For example, reactors 10C (FIG. 11) similar to reactor 10 or 10A may be provided over a conveyor 80 which allows for movement of conveyor 80 through the reactors 10C. Means may be incorporated into conveyor 80 for heating the substrate or heating means may be disposed adjacent conveyor 80 in a heat exchanging relationship with the substrate. A single substrate may then be serially moved through several reactors, as depicted schematically in FIG. 11, for the deposition on the same substrate of several thin films.

The reactor 10 depicted in FIGS. 1–9 has been utilized to form excellent quality large area thin films according to the process described herein. Reaction gap 12 in reactor 10 is 7 in. (17.78 cm) wide, 13 in. (33 cm) long and 0.030 in. (0.762 cm) thick. Entrance section 41 is 4 in. (10.16 cm) long, 7 in. (17.78 cm) wide and 2 in. (5.08 cm) high adjacent inlet 42, and surface 62 extends at an angle of about 27° with the horizontal. However, these dimensions are not critical, except for the reaction gap thickness which should preferably be less than about 0.100 in. (2.54 mm) thick. Reactor 10 may be scaled. The specific thickness of reaction gap 12 depends upon process parameters such as particular reactants, carrier gas flow rate, nebuli size, reactant concentration (reactant feed rate) and substrate temperature. For example, as reaction gap thickness is increased, higher feed rates are required to promote turbulence and higher reaction rates are required, noting that higher reaction rates are dependent upon the ability to maintain the required substrate temperature which in turn is dependent on heat transfer through the glass substrate, which can be limiting.

The carrier medium conducted reactant(s) may be contained in an atomized mist which may be generated by a conventional mist generator (reactant source 43) and conducted by a gaseous carrier medium to inlet 42. For example, reactant source 43 may be an ultrasonic nebulizer of the type disclosed in U.S. Pat. No. 3,387,607 (Gauthier et al.), which generates an atomized mist of a liquid solution conducted by a gaseous carrier medium, e.g., nitrogen or air, having nebuli sizes in the approximate range of 1–6 microns as described in the Gauthier et al. U.S. Pat. No. 3,387,607 (The primary gravity tube sorter described above is not shown and is part of the reactant source 43.)

The spray pyrolysis process according to the invention proceeds in apparatus 10 of FIGS. 1–9 as follows. Ultrasonic nebulizer 43 is provided with a water solution of the desired reactant(s) in the desired concentrations, and connected to a source of a desired carrier gas, e.g., nitrogen. The flow rate of the carrier gas is adjusted and the power adjustment control of the ultrasonic nebulizer set to deliver a desired amount of solution per unit time. Ultrasonic nebulizer 43 produces an atomized mist of the reactants which is conducted by the carrier gas to inlet 42 of entrance section 41 of reactor 10. Entrance section 41 introduces a highly turbulent flow of the smaller size nebuli into reaction gap 12 through outlet 46 of entrance section 41. The mist nebuli progress through the reaction gap 12 at a relatively high flow rate, coming into contact with surface 34 of substrate 14 for relatively short periods of time, as discussed above. Specially, the flow rate, reactant concentration and substrate temperature are selected to provide a desired reaction rate for depositing the film, which is believed to control the dwell time and reaction of mist nebuli on the substrate. The carrier gas together with unreacted and spent reactants is exhausted from reactor 10 through open side 50. The process in reaction gap 12 is carried out at ambient pressure. Further details of the spray pyrolysis process are described below. A chemical vapor deposition process proceeds similarly from a source of gaseous reactants and a carrier gas source, except that a fully gaseous flow is involved rather than a liquid/gas flow.

The spray pyrolysis process according to the invention operates at substrate temperatures considerably higher than most prior art spray pyrolysis processes. For example, when depositing CdS, the preferred substrate temperature range is about 430° C. to about 460° C. Below about 430° C., the film deposition rate is exceedingly slow, whereas the deposit rate is acceptable in the 200° C. to 500° range in other spray pyrolysis processes. Above about 460° C., CdS deposits over a relatively short length of substrate surface. Similarly, with other thin films formed in accordance with the invention, including CdTe, $In_2S_3$ and ZnS, a narrow temperature range, unique to each compound formed, is utilized. The preferred temperature ranges have been found to be inversely correlated with the negative free energy of formation ($\Delta G°$) of the compound film formed from the element. This correlation, plus the preferred narrow deposition temperature range requirements, differs from prior art spray pyrolysis, where, in general, a wide deposition temperature range and much lower temperatures can be used. These facts are believed to indicate that the process of the invention chemically proceeds differently than prior art spray pyrolysis processes.

Since there is a relationship in the spray pyrolysis process of the invention between substrate temperature, reaction time and film formation, minimum temperatures and preferred temperature ranges have been determined for several films. The minimum temperature is defined as that for which substantially no deposition takes place after about 20 minutes of contact between mist nebuli and a heated substrate. Table 1 below demonstrates minimum and preferred substrate temperatures for thin film compounds formed in reactor 10 by spray pyrolysis. Table 1 also demonstrates the empirical correlation between deposition temperature and free energy of formation ($\Delta G°$) of the film compound from its elements. Values for these film compounds for the reaction of metal plus sulfur going to metal sulfide, e.g., $Cd+S \rightarrow CdS$, and $Cd+Te \rightarrow CdTe$, are given in Table 1.

TABLE 1

| Film Compound Deposited | $\Delta G°$ form. (KCAL) Per Gram Atomic Wt. of Metal | Minimum Deposition Temperature (°C.) | Preferred Deposition Temperature (°C.) |
|---|---|---|---|
| CdTe | −24 | 600 | 500–600 |
| CdS | −37.4 | 350 | 430–460 |
| $In_2S_3$ | −49.3 | 220 | 240–260 |

The minimum temperatures noted in Table 1 are greater than the minimum temperatures taught in the prior art spray pyrolysis processes known to applicants. For example, for CdS deposition, a minimum substrate temperature of 200° C. to 300° C. is disclosed in "Highly Photoconducting $O_2$-Doped CdS Films Deposited By Spray Pyrolysis", by D. Richards et al., published in "J. Vac. Sci. Technol. A.", Vol. 2, April–June 1984, pages 332–335, and a minimum substrate temperature of about 188° is disclosed in "Properties of Spray Pyrolysis CdS Film And Its Application To Thin Film Solar Cell", by Yueh Yale Ma, October 1977 (a Dissertation submitted to the Department of Materials Science and Engineering and the Committee on Graduate Studies of Stanford University in partial fulfillment of the requirements for the degree of Doctor of Philosophy).

Thin films of CdS, CdTe, Cd, Te, $SnO_2$ and $In_2S_3$ were formed using reactor 10 and a DeVilbiss Model 65 Ultrasonic Nebulizer, with nitrogen as the carrier gas. The specific substrate temperature, gas flow rate, mist delivery rate, and solution concentrations varied with the reactants used and the specific film formed. As a general matter, the substrate temperatures are given in Table 1 for CdTe, CdS and $In_2S_3$ films, the gas flow rates were between about 2 and 15 S.C.F.H, and the feed delivery rates were between about 0.3 and 2.2 ml/min. It was noted that use of nitrogen (or other inert gas) was preferred so as to avoid the formation of oxides on the substrate which in some instances substantially prevented the formation of the desired film. In addition, it was found that subjecting the film to oxygen after the required thickness was formed and with the substrate still heated, improved film quality for certain films, e.g., CdS.

For typical film formations, the carrier gas flow rate, the mist delivery rate and the substrate temperature were such that depostion of the film proceeded relatively rapidly.

The following examples are illustrative of the process according to the invention.

EXAMPLE I (CdS Film By Spray Pyrolysis)

CdS films were formed on transparent, electrically conductive thin films deposited on glass substrates, for example, tin oxide films on glass (commercially available as Electric Glass from Cherry Display Products Corporation, El Paso, TX) and indium, tin oxide on glass (commercially available as full wave coating from Donnelly Mirrors, Inc., Holland, MI). A DeVilbiss Model 65 Ultrasonic Nebulizer was used as source 43 to generate an atomized mist of the mist composition given below having fine nebuli sizes in the micron range. The films were formed at ambient pressure. The mist composition was as follows: 0.01 mol/liter $CdCl_2$ and 0.011 mol/liter thiourea water solution. The carrier gas was nitrogen. The carrier gas flow rate was 15 S.C.F.H.; the solution delivery rate was 2.1 ml/min; and the substrate temperature was 450° C.

The resulting CdS thin films were 1500 to 3000 angstroms thick. Under 20,000 magnification, the films appeared smooth and continuous, appeared to be essentially without visible undulations and without discontinuities (i.e. discontinuities greater than about 0.2 micron which would be visible). Light or photoconductivity to dark conductivity ratios as high as $10^4$ have been achieved. This light to dark conductivity ratio compares favorably with 100 for a tested competitive material. Speed of response (rate of change from light conductivity to dark value when light is turned off as an indicator of trap site density), is another indicator of product quality. The competitive material mentioned above gave speed of response values of the order of ten seconds whereas material may be made in accordance with the invention with response speeds so low (less than one second) that they cannot be measured with a pen recorder.

Efficiencies for 4 cm$^2$ photovoltaic cells having electrodeposited CdTe on CdS thin film layers deposited in accordance with the invention on an SnO$_2$ layer to form heterojunctions, were greater than 10%.

It was found that varying the Cd:S concentration affected the properties of the CdS film, and that with a 2:1 Mol ratio concentration of CdCl$_2$: thiourea, films having lower election trap densities were formed.

EXAMPLE II (CdTe Film By Spray Pyrolysis)

CdTe films were formed on a glass substrate. The solution composition was: 0.21 mol/liter CdCl$_2$; 0.017 mol/liter telluric acid, 10.0 mol/liter formic acid; the carrier gas flow rate was 5 S.C.F.H.; the solution delivery rate was 0.9 ml/min, and the substrate temperature was 515° C. The quality and characteristics of these films were as described with respect to Example I.

It is believed that equally good quality CdS films are obtainable using reactor 10 to carry out film formation by chemical vapor deposition of dimethyl cadmium or diethyl cadmium and hydrogen sulfide conducted by nitrogen or argon as the carrier medium.

The examples and detailed process parameters given above and the description of the preferred embodiments are illustrative and are not meant to be limiting. Certain changes and modifications to the process and apparatus described herein will be readily apparent to those skilled in the art. For example, films other than those specifically described may be formed by the process and apparatus of the invention, e.g., many oxide, metal and sulfide films may be formed. These films may be of electrically conducting material, semiconductor material and insulating material, and may be used for various products and applications including, but not limited to, conductors, resistors, semiconductor devices, etc., for many electronic and other applications. In addition, the specific process parameters may be varied in accordance with the films to be formed and the characteristics desired of such films. Also, certain variations including size variations and process parameter variations may be made to the apparatus and process disclosed herein. It is the applicants' intention to cover by the claims all such modifications, changes and uses which do not depart from the spirit and scope of the invention.

What is claimed is:

1. A method of forming a thin film on a substrate comprising the steps of conducting one or more reactants in gaseous or atomized nebuli form from which the film is to be formed in a turbulent flow past the substrate in a contacting relationship therewith through a reaction gap having a thickness of less than about 0.1 inch, heating the substrate to above a predetermined temperature which is greater than the minimum temperature at which substantially no deposition takes place on the substrate after contacting the substrate with the one or more reactants for approximately 20 minutes, and controlling the temperature of the heated substrate.

2. The method according to claim 1 wherein the one or more reactants are conducted by a gaseous carrier medium.

3. The method according to claim 1 including atomizing a solution of the one or more reactants to form the atomized nebuli which contain the one or more reactants, and conducting the atomized nebuli along the substrate surface by means of a gaseous carrier medium.

4. The method according to claim 3 including sorting the atomized nebuli prior to conducting them along the substrate surface to substantially prevent larger nebuli from coming into contact with the substrate surface.

5. The method according to claim 3 including maintaining the substrate at substantially a temperature and conducting the atomized nebuli along the substrate surface substantially at a flow rate and concentration preselected for a particular reactant or reactants, to thereby control the reaction rate at which the film is formed.

6. A method of forming a thin film on a substrate comprising the steps of positioning the substrate in a reaction chamber such that a reaction gap having a thickness of less than about 0.1 inch is formed between the surface of the substrate on which the film is to be formed and an opposed surface in the reaction chamber, conducting one or more reactants in gaseous or atomized nebuli form from which the film is to be formed in a turbulent flow past the substrate in a contacting relationship therewith through the reaction gap, heating the substrate to above a predetermined temperature which is greater than the minimum temperature at which substantially no deposition takes place on the substrate after contacting the substrate with the one or more reactants for approximately 20 minutes, and controlling the temperature of the heated substrate.

7. The method according to claim 6 including atomizing a solution of the one or more reactants to form the atomized nebuli which contain the one or more reactants and conducting the atomized nebuli along the substrate surface by means of a gaseous carrier medium.

8. The method according to claim 7 including sorting the atomized nebuli prior to conducting them along the substrate surface to substantially prevent larger nebuli from coming into contact with the substrate surface.

9. The method according to claim 1 wherein the reactants include Cd and Te sources and film to be formed is CdTe, and the predetermined temperature is greater than 500° C.

10. The method according to claim 1 wherein the reactants include Cd and S Sources and the film to be formed is CdS, and the predetermined temperature is about 430° C.

11. The method according to claim 1 wherein the reactants include In and S Sources and the film to be formed is In$_2$S$_3$, and the predetermined temperature is about 240° C.

* * * * *